United States Patent [19]
Singh et al.

[11] Patent Number: 5,847,464
[45] Date of Patent: Dec. 8, 1998

[54] METHOD FOR FORMING CONTROLLED VOIDS IN INTERLEVEL DIELECTRIC

[75] Inventors: Abha R. Singh, Carrollton, Tex.; Artur P. Balasinski, Scottsdale, Ariz.; Ming M. Li, Plano, Tex.

[73] Assignee: SGS-Thomson Microelectronics, Inc., Carrollton, Tex.

[21] Appl. No.: 534,669

[22] Filed: Sep. 27, 1995

[51] Int. Cl.$^6$ .......................... H01L 23/48; H01L 23/52; H01L 29/40
[52] U.S. Cl. ........................................... 257/752; 257/758
[58] Field of Search .................................. 257/752, 786, 257/758

[56] References Cited

U.S. PATENT DOCUMENTS

| | | | |
|---|---|---|---|
| 5,114,530 | 5/1992 | Rao et al. | 156/653 |
| 5,252,520 | 10/1993 | Kocmanek et al. | 437/235 |
| 5,268,193 | 12/1993 | Beuhler et al. | 427/96 |
| 5,279,865 | 1/1994 | Chebi et al. | 427/574 |
| 5,344,797 | 9/1994 | Pai et al. | 437/238 |
| 5,512,775 | 4/1996 | Cho | 257/522 |
| 5,621,241 | 4/1997 | Jain | 257/632 |

FOREIGN PATENT DOCUMENTS

| | | | |
|---|---|---|---|
| 0 327 412 A1 | 8/1989 | European Pat. Off. | H01L 23/28 |
| 0 386 337 A2 | 9/1990 | European Pat. Off. | H01L 21/311 |
| 62-005643 | 1/1987 | Japan | H01L 21/88 |
| 63-098134 | 4/1988 | Japan | H01L 21/90 |
| 63-318752 | 12/1988 | Japan | H01L 21/88 |
| 2-086146 | 3/1990 | Japan | H01L 21/90 |

OTHER PUBLICATIONS

Research Disclosure, No. 303, May, 1990, "Low Temperature Planarized Pre-Metal Passivation".
Ting, Chiu et al., "A Strategy to Accelerate the Implementation of Low KILD Materials in ULSI Interconnections," in Advanced Metallization for ULSI Applications in 1994, Roc Blumenthal and Guido Janssen, eds. pp. 351–360.

Singh, Abha et al., 37 Process Integrated of High Density Plasma Film With Chemical Mechanical Polishing and Sacrificial Etchback Processes for Sub–0.5 $\mu$m Multi–Layer Metal Structures.

*Primary Examiner*—Mahshid D. Saadat
*Assistant Examiner*—S. V. Clark
*Attorney, Agent, or Firm*—Theodore E. Galanthay; Lisa K. Jorgenson; Irena Lager

[57] ABSTRACT

A method of forming a thick interlevel dielectric layer containing sealed voids formed in a controlled manner, over a substantially planar surface in semiconductor device structure, and the semiconductor structure formed according to such a method. The sealed voids are used to reduce interlevel capacitance. A plurality of metal signal lines are formed over a globally planarized insulator. A thick layer of first conformal interlevel dielectric is deposited over the metal signal lines and over the intermetal spacings formed between the metal signal lines. Because of the thickness, flow properties, and manner of deposition of the interlevel dielectric and the aspect ratio the intermetal spacings, voids are formed in the first conformal interlevel dielectric, in the intermetal spacings. This interlevel dielectric is then etched or polished back to the desired thickness, which exposes the voids in the wider intermetal spacings, but does not expose voids in the narrower intermetal spacings. An etchback may be chosen so that all voids are exposed. The exposed voids are filled with a flowable dielectric which can be then etched back to leave the flowable dielectric in the exposed voids. A second conformal interlevel dielectric layer is formed over the first conformal interlevel dielectric to further bury the sealed voids, insuring that they do not get exposed in further process steps. The second conformal interlevel dielectric may be formed in a thin layer to allow the flowable dielectric to remain near the top of the interlevel dielectric structure to reduce the possibility of poisoned vias.

52 Claims, 7 Drawing Sheets

METHOD FOR FORMING CONTROLLED VOIDS IN INTERLEVEL DIELECTRIC

The present invention relates to the field of integrated circuits, and is more specifically directed to forming controlled voids in the interlevel dielectric layers.

BACKGROUND OF THE INVENTION

A goal in the semiconductor industry is to reduce the size of integrated circuit device for a given functionality. One advantage of reducing device size is typically an increase in the speed of the circuit due to the quicker switching speeds of the transistors. However, as device size and distances between device components get smaller, the capacitance associated with conductors increases, causing an increase in the circuit internal RC delay, and thus slowing down the speed of the circuit.

Several layers of conductors are generally used in the active components of an integrated circuit device. The upper layers of these conductors are typically formed of metal, for example as shown in the cross-sectional view of a conventional device in FIG. 1a, at each layer metal signal lines 11, 12, 13, 14, 15, and 16 overlie an insulation layer 44. A thin layer of interlevel dielectric 7 overlies the metal signal lines and the intermetal spacings, 17, 18, 19, 20, and 21. The aspect ratio of the intermetal spacings is the ratio of the thickness of the metal signal lines surrounding the intermetal spacing to its width. As the width of the intermetal spacing is made smaller without changing the thickness of the lines, the aspect ratio of the intermetal spacing becomes larger. When the interlevel dielectric is conformal, voids 22, 23, 24, 25, and 26 may form in the interlevel dielectric between metal signal lines. At locations where the intermetal spacing is narrow and the aspect ratio of the intermetal spacings is greater than one, the voids may be sealed.

Figure 1A:
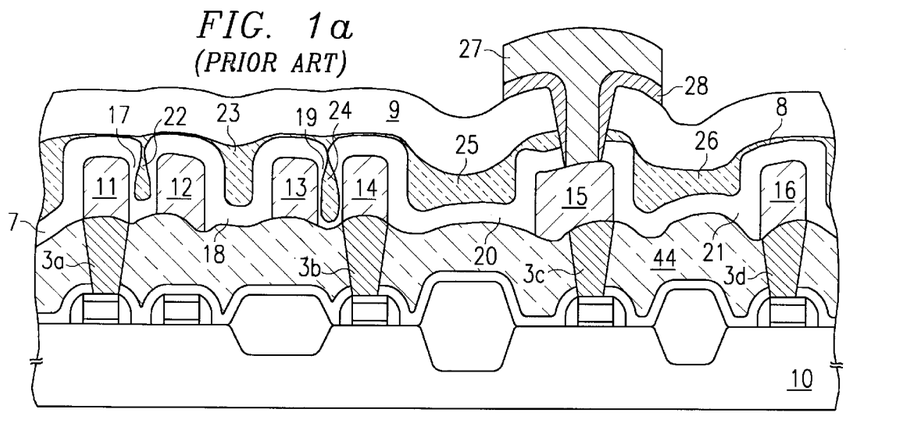
FIGS. 1a, 1b, and 2 are cross-sectional views of conventionally formed interlevel structures.

As illustrated in FIG. 1a, in the prior art most voids are not sealed. The voids 24 that are sealed only have a thin layer of interlevel dielectric sealing the void, so overetch in future process steps could open the voids and expose them to contamination. This presentes problems including possible moisture or metal contamination leading to poor device performance, reduced reliability, and shortened device life. Thus, an objective in the prior art is to open all of the voids and fill them with a dielectric. A layer of spin-on-glass (SOG) or spin-on-polymer (SOP), hereinafter flowable dielectric, is usually used to fill in voids 22, 23, 25, and 26.

In the prior art, various silicon oxides, primarily $SiO_2$, have been used as interlevel dielectrics. There is a shift to use fluorinated $SiO_2$, which has a lower dielectric constant, as the interlevel dielectric in order to reduce interlevel capacitance. There is also experimentation in using organic spin-on-polymers as interlevel dielectrics. All of these materials have proven inadequate for today's sub-micron technologies. One problem in the prior art is that organic spin-on-polymers present problems due to etch complexity, to moisture content that can cause short circuits, and to temperature limitations that present problems in backend processing.

A further problem is that it is also now becoming disadvantageous to reduce the geometries of the integrated circuit further because, as the metal signal lines are placed closer together, the RC delay caused by the high capacitance between the lines reduces the speed of the circuit. As the distance between metal signal lines is reduced, the capacitance between the metal signal lines, hereinafter interlevel capacitance, increases. The interlevel capacitance is dependent on the ratio of the dielectric constant of the dielectric to the width of the intermetal spacing between the metal signal lines.

By way of further background, Ting et al., "A Strategy to Accelerate the Implementation of Low K ILD Materials in ULSI Interconnections", *Advanced Metallization for ULSI Applications in* 1994, Blumenthal et al. ed., Material Research Society, Pittsburgh, 1995, pages 351–353, describes the increase in capacitance between metal signal lines as the distance between them decreases. As shown in FIG. 1 on page 352 of this text, when the dielectric is thermal $SiO_2$, having a dielectric constant of 3.9, the capacitance increases drastically as the distance between the metal signal lines is reduced below 0.5 µm.

Thus, one way to reduce the intermetal capacitance, especially at small distances between the metal signal lines, is by using the dielectric material with a low dielectric constant. It has been observed in connection with the current invention, that using air or another atmosphere in which the integrated circuit is manufactured as an intermetal dielectric would result in lower interlevel capacitance, since air has a dielectric constant of 1. However, as can be seen in FIG. 1a, the process used in the prior art does not ensure that sealed voids would remain buried under a layer of interlevel dielectric or that all voids would be filled with flowable dielectric, presenting the possibility that a void that was at first sealed, would be opened and exposed during subsequent etch steps. Moisture or metal from the next metallization level can form in such an opened and exposed void, causing shorts, corrosion, metal step coverage problems, or via poisoning. It is therefore necessary to ensure that the voids formed are either all filled with flowable dielectric or that the sealed voids remain sealed, as according to the present invention. This is difficult to ensure since in the prior art the voids are not formed in a controlled manner, and it is difficult to predict where the voids are formed.

Figure 1B:
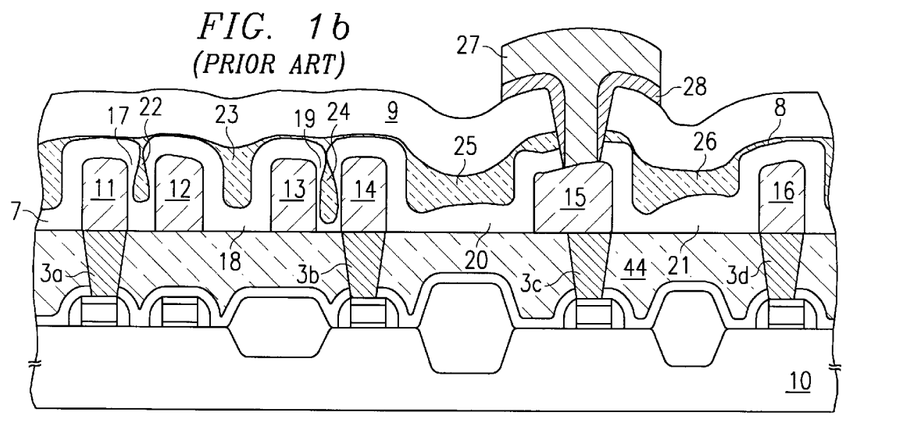

Referring to FIG. 1b, an alternative prior art process is described. In this example the underlying insulation layer is planarized, and a thin layer of conformal interlevel dielectric 7 overlies the metal signal lines 11, 12, 13, 14, 15, 16 and insulation layer 44. The thin layer of conformal interlevel dielectric 7 produces large voids 25 and 26 in the interlevel dielectric. After these voids are filled with a flowable dielectric and the flowable dielectric is etched back, trenches are formed in voids 25 and 26. This presents a non-planar surface for the next interlevel structure, so subsequent interlevel structures have the same problems in forming controlled voids as the structure presented in FIG. 1a.

Additionally, in conventional processes, sealed voids are only formed in very narrow intermetal spacings with an aspect ratio greater than one, so only the capacitance in very narrow intermetal spacings is affected. Furthermore, there is a high probability that the void will be opened and contaminated in a later processing step. As determined in the present invention both of these problems stem from the proportional thickness of the dielectric to the width of the intermetal spacing. The thin layer of the dielectric overlying the metal signal lines also leads to the thickness of the interlevel dielectric above any void, sealing it, to be very small.

Referring now to both FIG. 1a and 1b, if the flowable dielectric is SOG, and it is exposed toward the bottom of the vias formed in the interlevel dielectric, if aluminum 27 is used to fill the via a poisoned via may result. Although titanium, titanium nitride, titanium tungsten or a combination thereof 28 is usually deposited in the via to form a liner layer, when the liner layer is sputter deposited the liner may be very thin toward the bottom on the via. SOG exposed at the bottom of the via will not be contained by liner and will outgas, causing a poisoned via.

Figure 2:
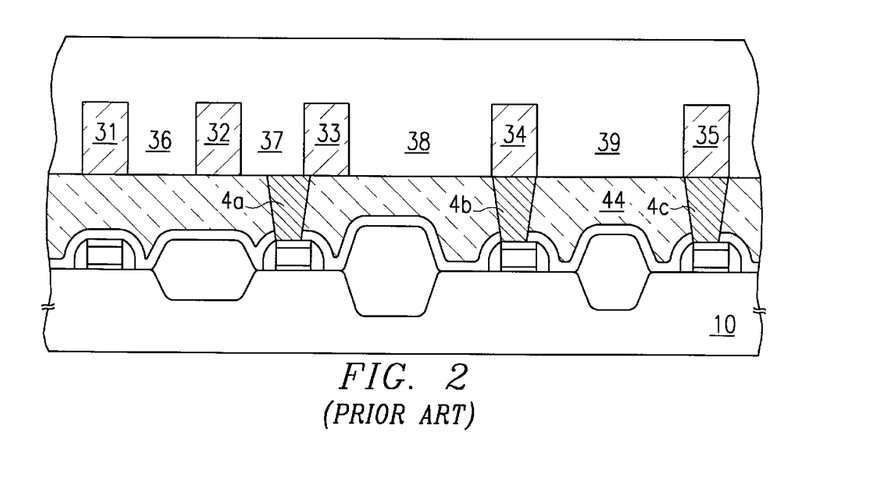

Referring now to FIG. 2, an alternative prior art integrated circuit is described. Metal signal lines 31, 32, 33, 34 and 35 overlie an insulation layer 44. The interlevel dielectric is deposited using high density plasma (HDP), a simultaneous deposit and etch process, to fill the entire intermetal spacing, typically without creating any voids. Using HDP and a typical dielectric material, voids will most likely not form in intermetal spacings having a width 0.25 µm and above, and an aspect ratio of 3 or below.

It is therefore an object of this invention to provide a method of forming voids between conductive lines in a controlled and reliable manner.

It is a further object of this invention to provide a method of forming voids between conductive lines and yet presenting a planar, void-free surface for a subsequent layer of metallization.

It is a further object of this invention to provide a method such that all voids formed in intermetal spacings greater than a threshold width are exposed and filled with a flowable dielectric, and all voids formed in intermetal spacings of less than, or equal to, a threshold width are sealed.

It is a further object of this invention to provide a method such that all voids formed in intermetal spacings are exposed and filled with a flowable dielectric.

It is a further object of this invention to provide a method such that interlevel capacitance is reduced.

It is a further object of this invention to provide a method to increase the speed of an integrated circuit where the width of the intermetal spacings between metal signal lines are smaller than a threshold width.

It is a further object of this invention to provide a method to reduce RC delay in an integrated circuit due the width of the intermetal spacings between metal signal lines being smaller than a threshold width.

It is a further object of this invention to provide a method to reduce the possibility of poisoned vias.

It is a further object of this invention to provide such a method that utilizes conventional process flows.

It is further an object of the present invention to provide an integrated circuit formed according to such a method.

Other objects and advantages of the invention will be apparent to those of ordinary skill in the art having reference to the following specification together with the drawings.

SUMMARY OF THE INVENTION

The invention may be incorporated into a method for forming a semiconductor device structure, and the semiconductor structure formed according to such a method, in which controlled voids are formed in the interlevel dielectric. Selected voids are sealed, reducing the interlevel capacitance. A plurality of metal signal lines are formed over a globally planarized insulator layer. A thick layer of a conformal interlevel dielectric is deposited over the metal signal lines and over the intermetal spacings formed between the metal signal lines. Because of the thickness and conformal properties of the interlevel dielectric and the aspect ratio of the intermetal spacings, voids are formed in the first conformal interlevel dielectric, in the intermetal spacings. This interlevel dielectric is then etched or polished back to the desired thickness, which exposes the voids in the wider intermetal spacings, but does not expose voids in the narrower intermetal spacings. The exposed voids are filled with a flowable dielectric which can be then etched back to leave the flowable dielectric in the exposed voids. A second conformal interlevel dielectric layer is formed over the first conformal interlevel dielectric to further bury the sealed voids, ensuring that they do not get exposed in further process steps. The second conformal interlevel dielectric may be formed in a thin layer to allow the flowable dielectric to remain near the top of the interlevel dielectric structure to reduce the possibility of poisoned vias.

BRIEF DESCRIPTION OF THE DRAWINGS

FIGS. 4a through 4h are cross-sectional views illustrating various steps in the fabrication of the integrated circuit in FIG. 3a.

FIG. 7 is an electrical diagram, in schematic form, of the capacitances in intermetal spacing 62 of FIG. 3a.

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

Figure 3A:
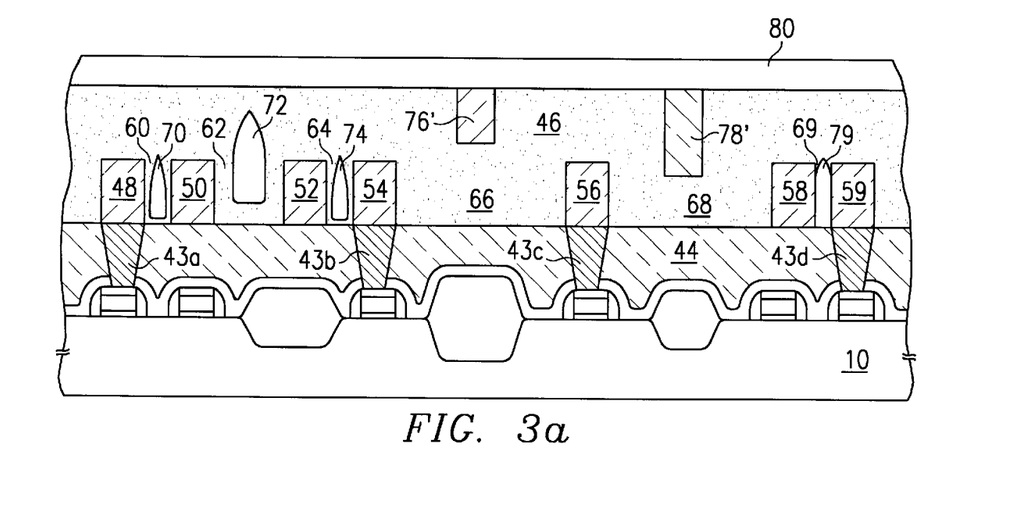
FIGS. 3a and 3b are cross-sectional views of an integrated circuit formed according to the present invention.

Referring to FIG. 3a the physical construction of an integrated circuit formed according to the preferred embodiment of the present invention will now be described in detail. An insulation layer 44 overlies substrate 10, and transistors formed thereon, the details of which are not important to the present invention. Insulation layer 44 can be borophosphosilicate glass (BPSG), phosphosilicate glass (PSG), or any other doped or undoped silicon oxide. According to the present invention, insulation layer 44 has a globally planarized top surface, presenting a flat surface for subsequent layers to insure proper formation of controlled voids. Contact holes are etched through insulation layer 44 and contain contact plugs 43a through 43d for connecting the substrate 10 and the subsequent metallization layer.

A metallization layer overlies insulation layer 44. The metallization layer comprises conductive regions 48, 50, 52, 54, 56, 58, 59, which are typically metal signal lines. In modern processing the metal signal lines are between 0.8 µm and 1.2 µm thick.

A first conformal interlevel dielectric 46 overlies insulation layer 44 and metal signal lines 48, 50, 52, 54, 56, 58, 59 and extends above the metal signal lines. The top surface of first conformal interlevel dielectric 46 is globally planar. Voids 70, 72, 74, 76', 78', 79 are formed in the first conformal interlevel dielectric 46 in intermetal spacings having a width below a first threshold, which is dependent on the conformal properties of first conformal interlevel dielectric 46 and the aspect ratio of the intermetal spacings. The thickness of first conformal interlevel dielectric 46 above the metal signal lines is selected to leave a desired thickness of first conformal interlevel dielectric 46 above the voids that are to remain sealed. Those voids 70, 72, 74, 79 which are in intermetal spacings having a width smaller than a selected second threshold width remain sealed. The second threshold width is based on the ratio of the dielectric constant of each dielectric filling the intermetal spacing to the width of each of the dielectrics, and is selected to achieve a capacitance in the intermetal spacing below a certain desired capacitance. Voids 76', 78' in intermetal spacings wider than this second threshold width are opened and filled with flowable dielectric 84. For example, in order to leave a desired thickness of first conformal interlevel dielectric 46 above voids formed in intermetal spacings below 0.5 $\mu$m when the metal signal lines are 0.8 $\mu$m to 1.2 $\mu$m thick, the preferred thickness that first conformal interlevel dielectric extends above the metal signal lines is 0.5 $\mu$m to 1.2 $\mu$m.

Metal signal lines adjacent to narrower intermetal spacings 60, 62, 64 have sidewall coverage of first conformal interlevel dielectric. Metal signal lines adjacent to even narrower intermetal spacing 69 have negligible sidewall coverage. For example, sealed void 79 practically fills the entire intermetal spacing 69. The width of intermetal spacing 69 below which the void will fill the entire intermetal spacing is dependent on the properties of first conformal interlevel dielectric 46, and the deposition method. Typically, the intermetal spacing will be at most 0.3 $\mu$m wide.

A second conformal interlevel dielectric 80 overlies first conformal interlevel dielectric 46. The combined thickness of the first conformal interlevel dielectric 46 and second conformal interlevel dielectric 80 is selected based on balancing the advantages of increasing the thickness of dielectric above the sealed voids and the ease of etching vias through the interlevel dielectric structure for contact with subsequent metallization layers. For conventional processing the combined thickness of the first conformal interlevel dielectric 46 and second conformal interlevel dielectric 80 is between is 0.8 $\mu$m and 1.5 $\mu$m, preferably between 1 $\mu$m and 1.2 $\mu$m. Since the top surface of first conformal interlevel dielectric 46 is globally planar and second conformal interlevel dielectric 80 is conformal, the top surface of second conformal interlevel dielectric 80 is also globally planar.

Figure 3B:
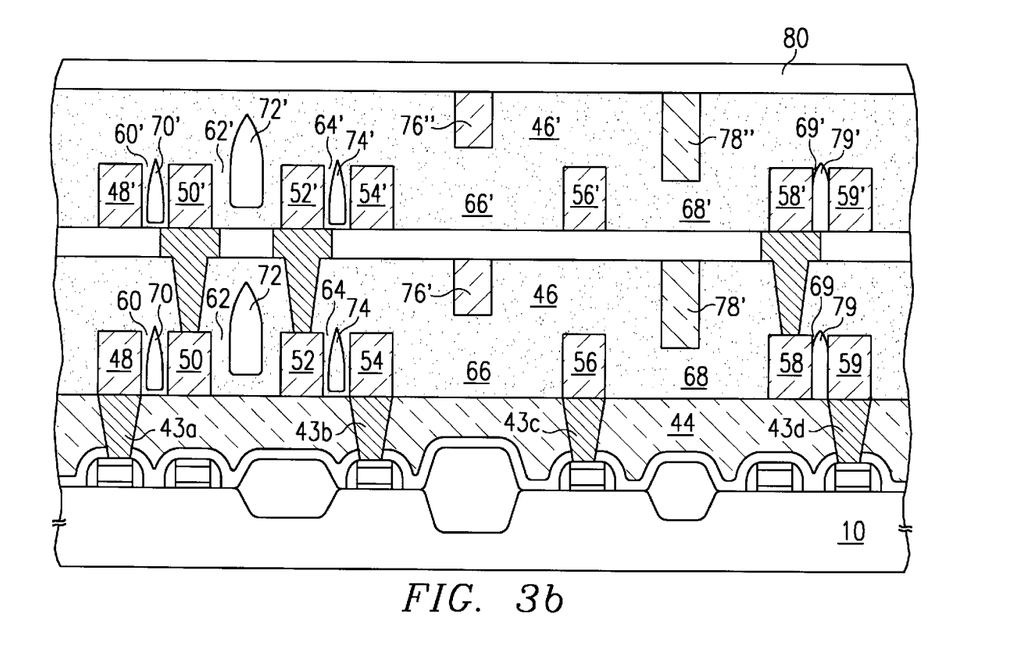

Alternatively, as shown in FIG. 3b, the metal signal lines 48', 50', 52', 54', 56', 58', and 59', making up the metallization layer overlie a lower layer interlevel dielectric 46, instead of the insulation layer 44. The remainder of the structure does not vary from the one described above.

The present integrated circuit contains sealed voids formed in a controlled manner in the interlevel dielectric. These voids contain the atmosphere the integrated circuit is exposed to during its manufacturing, typically air, which has a dielectric constant of 1. Therefore, the capacitance in an intermetal spacing having a sealed void is much lower than in an intermetal spacings filled with either just silicone dioxide or a combination of silicone dioxide and the flowable dielectric. The lower capacitance presents the advantage of reduced RC delay of signals traveling along metal signal lines.

The voids in the current invention are formed in a controlled manner, and are either exposed and filled or remain sealed and buried under the first and second conformal interlevel dielectric. This ensures that any sealed voids remain sealed, eliminating the problems stemming from voids not filled with flowable dielectric becoming opened and exposed to moisture or other contaminants, causing shorts or reducing the life span or accuracy of the device, generally associated with voids.

Figure 4A:
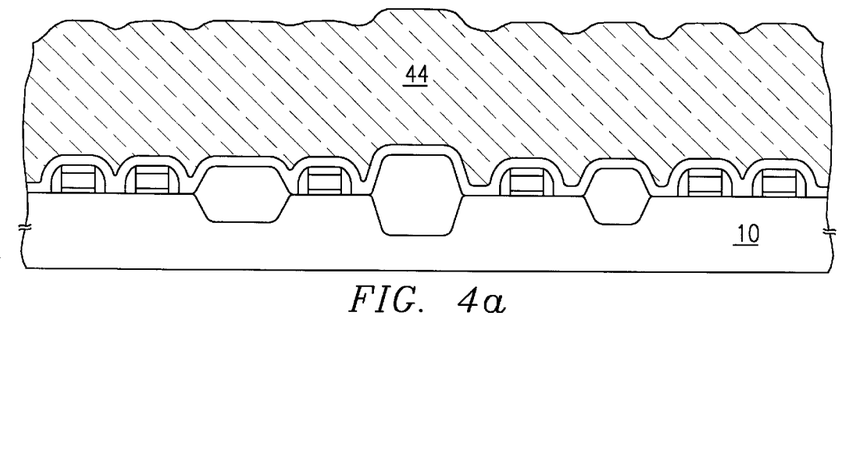

A method will now be described by which the above integrated circuit can be fabricated according to the preferred embodiment of the invention. Referring to FIG. 4a, an insulation layer 44 is formed on a substrate 10, preferably by chemical vapor deposition (CVD). Insulation layer 44 can be BPSG, PSG, or any other doped or undoped silicon oxide. Insulation layer 44 is deposited at a thickness required to insure good insulation between the metallization layer to be formed over it and underlying layers, for example between 1 $\mu$m and 1.5 $\mu$m.

Figure 4B:
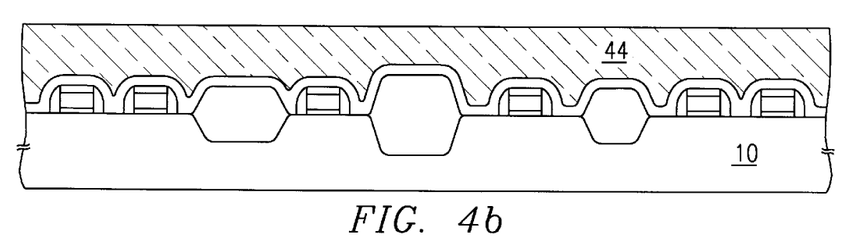
Figure 4C:
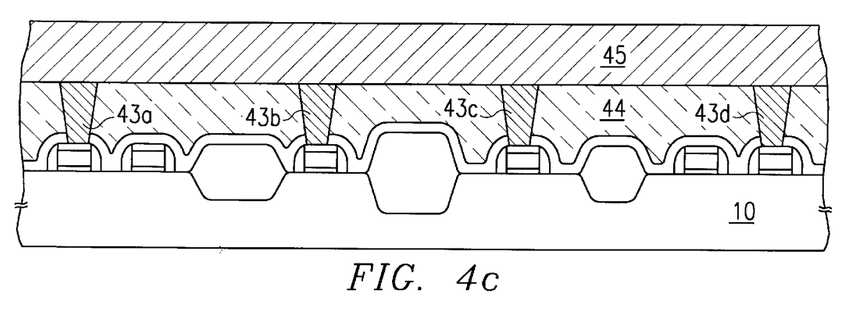

Referring now to FIG. 4b, insulation layer 44 is etched back, preferably using chemical mechanical polishing (CMP), sacrificial flowable dielectric etchback, or resist etchback to achieve good global planarity and the desired thickness required to insure good insulation. In modern processes the desired thickness is approximately 0.4 $\mu$m at the thinnest portion of insulation layer 44 and 1 $\mu$m at the thickest portion of insulation layer 44. The top surface of insulation layer 44 should have a globally planar top surface. It is important that the surface presented to the interlevel structure is globally planarized, since a flat surface is needed to form controlled voids. As shown in FIG. 4c, contact holes are etched through insulation layer 44, and contact plugs 43a through 43d, typically formed of tungsten, are formed according to conventional methods between substrate 40 and the subsequent metallization layer.

Figure 4D:
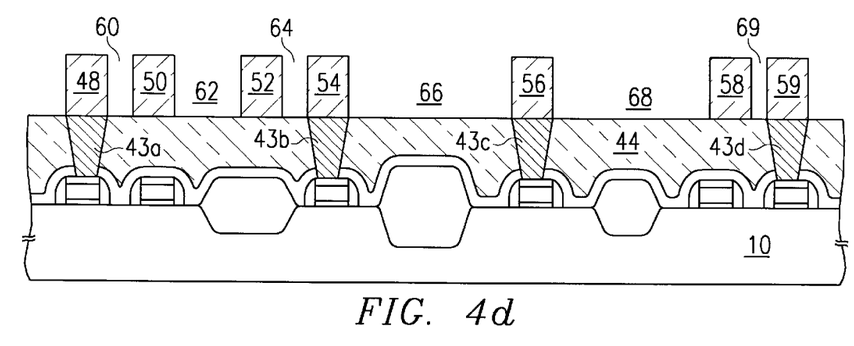

As illustrated in FIG. 4c, a metallization layer 45 is then formed above the insulation layer. In modern processes, the thickness of the metal is between 0.8 $\mu$m and 1.2 $\mu$m. The metal can be aluminum, tungsten, or any other conductor or combination thereof used for forming metal signal lines. Referring now to FIG. 4d, the metal is patterned to form metal signal lines 48, 50, 52, 54, 56, 58, 59. Intermetal spacings 60, 62, 64, 66, 68, 69 are left between metal signal lines 48 and 50, 50 and 52, 52 and 54, 54 and 56, 56 and 58, and 58 and 59, respectively.

Figure 4E:
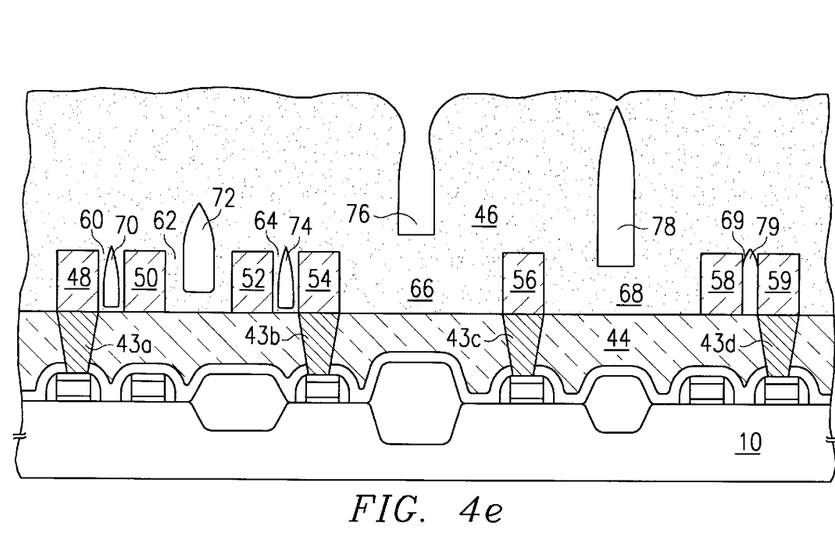

Referring now to FIG. 4e, a thick layer of first conformal interlevel dielectric 46 is deposited over the metal signal lines 48, 50, 52, 54, 56, 58, 59 and the intermetal spacings 60, 62, 64, 66, 68, 69. The first conformal interlevel dielectric 46 can be silane based or TEOS based, undoped or fluorinated $SiO_2$. Fluorinated $SiO_2$ is preferable to undoped oxide because the dielectric constant of the fluorinated oxide is less than the dielectric constant of undoped oxide. It is important not to over dope the oxide to concentrations at which the fluorinated oxide can become corrosive. Using current technology, the oxide can be doped with fluorine to achieve a dielectric constant as low as 3. First conformal interlevel dielectric 46 can be deposited by plasma enhanced chemical vapor deposition (PECVD), atmospheric pressure chemical vapor deposition (APCVD), or high density plasma (HDP). PECVD and APCVD are preferred to HDP since HDP is a simultaneous deposit and etch process and thus produces smaller voids.

First conformal interlevel dielectric 46 is deposited thick enough to allow first conformal interlevel dielectric 46 to be etched back to achieve a globally planar top surface and still be thick enough to seal all voids formed in intermetal spacings below a threshold width. Using modern process technology first conformal interlevel dielectric is deposited between 1 $\mu$m to 2.5 $\mu$m thick, preferably between 1.5 $\mu$m and 2.0 $\mu$m thick. It is not desirable to deposit the first conformal interlevel dielectric 46 thicker than 2.5 $\mu$m because at a thickness of above 2.5 $\mu$m the first conformal interlevel dielectric may crack.

Voids 70, 72, 74, 76, 78, 79 are formed in the first conformal interlevel dielectric 46 in intermetal spacings 60, 62, 64, 66, 68 69, respectively. Since the first conformal interlevel dielectric 46 is conformal and the top surface of insulation layer 44 is planarized, voids 70, 74 formed in intermetal spacings of the same width are the same height above the bottom of the device. The shape and position of a void is dependent on the conformal properties of the dielectric, the deposition method of the dielectric, the width of the intermetal spacing in which the void is formed, and the thickness of the metal signal lines forming the intermetal spacing.

Figure 4F:
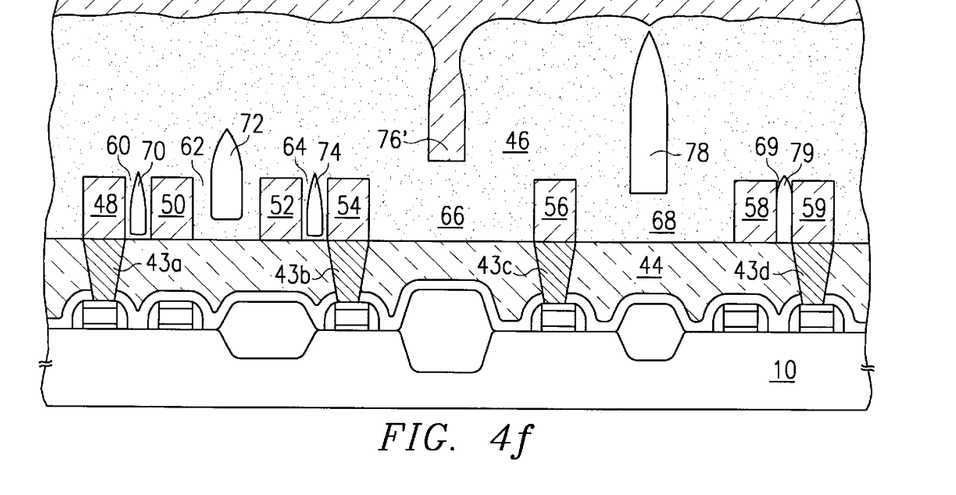

Referring to FIG. 4f, to achieve good regional planarization, flowable dielectric 47 with good flow properties and void-fill capabilities is deposited over the first conformal interlevel dielectric 46. Preferably, Hitachi R7-13 SOG is used. The flowable dielectric should be thick enough to facilitate the planarization of first conformal interlevel dielectric 46. The flowable dielectric is preferably deposited at the maximum thickness in the range of 6000 Å to 12000 Å at which it will not crack, in using modern processes and material the flowable dielectric can be deposited at a thickness of 4000 Å to 6000 Å. The flowable dielectric is then vacuum cured. To achieve better regional planarization a second layer of flowable dielectric can be deposited, again at a thickness of 4000 Å to 6000 Å, and then vacuum cured. The second layer of flowable dielectric is also preferably Hitachi R7-13 SOG. The second layer of flowable dielectric is not necessary in all applications.

Figure 4G:
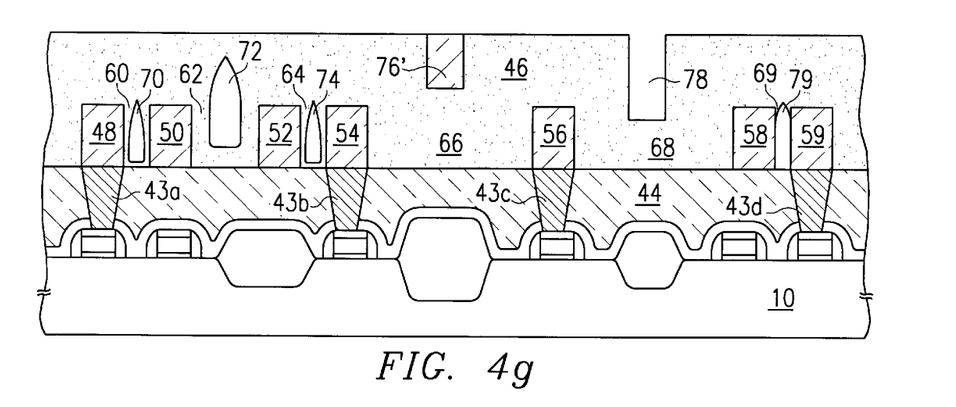

Referring now to FIG. 4g, an etchback of the first conformal interlevel dielectric 46 and flowable dielectric 47 is performed, preferably using CMP, or sacrificial flowable dielectric or resist etchback with a 1 to 1 etch rate selectivity. The thickness first conformal interlevel dielectric 46 extends above the metal signal lines is selected to leave a desired thickness of first conformal interlevel dielectric 46 above the voids that are to remain sealed. Between 0.5 $\mu$m and 1.5 $\mu$m, preferably between 0.8 $\mu$m and 1.2 $\mu$m, of first conformal interlevel dielectric 46 is left above the metal signal lines.

Figure 5A:
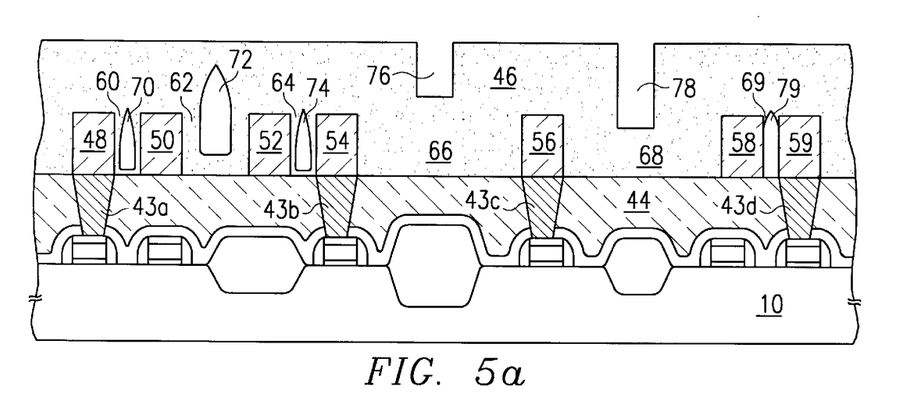
FIGS. 5a and 5b are cross-sectional views illustrating various alternate steps in the fabrication of the integrated circuit according to the present invention.

Alternatively, to achieve better global planarization, the flowable dielectric 47 is not deposited over first conformal interlevel dielectric 46. In this case, after first conformal interlevel dielectric 46 is deposited as shown in FIG. 4e and described above, it is etched or polished back, as shown in FIG. 5a, preferably using CMP, sacrificial flowable dielectric etchback, or resist etchback, to achieve global planarization. The thickness first conformal interlevel dielectric 46 extends above the metal signal lines is selected to leave a desired thickness of first conformal interlevel dielectric 46 above the voids that are to remain sealed. Between 0.5 $\mu$m and 1.5 $\mu$m, preferably 0.8 $\mu$m to 1.2 $\mu$m, of first conformal interlevel dielectric 46 is left above the metal signal lines.

The advantages of more controlled void formation in narrow intermetal spacings and of reducing the possibility of poisoned vias presented by better regional planarization should be balanced with the advantages of better global planarization to determine whether, based on the geometry and function of the integrated circuit, the flowable dielectric should be deposited before etching back first conformal interlevel dielectric 46. Etching back first conformal interlevel dielectric 46 without depositing flowable dielectric 47 over it produces better global planarization, while depositing the flowable dielectric 47 before the etchback produces better regional planarization over a region of approximately 20 $\mu$m. For integrated circuit devices where the metal signal lines are not placed further apart than 20 $\mu$m the use of flowable dielectric is preferred.

Regardless of whether the flowable dielectric 47 is deposited before the etchback, the thickness to which first conformal interlevel dielectric 46 extends above the metal signal lines after etchback is selected to leave a desired thickness of first conformal interlevel dielectric 46 above those voids that are to remain sealed. As the width of intermetal spacings decreases intermetal capacitance increases, causing an increase in the circuit internal RC delay, and thus slowing down the speed of the circuit. The intermetal capacitance increases drastically, and reaches unacceptably high values, as the width of the intermetal spacing reaches below a certain threshold width. This threshold width is a function of the dielectric constant of the interlevel dielectric, for example for thermal $SiO_2$, having a dielectric constant of 3.9, the capacitance increases drastically as the distance between the metal signal lines is reduced below 0.5 $\mu$m. Sealed voids in first conformal interlevel dielectric reduce the intermetal capacitance. The more the first conformal interlevel dielectric 46 extends above the metal signal lines the wider the intermetal spacing in which voids will remain sealed and the greater the thickness of first conformal interlevel dielectric that remains above the sealed voids.

Referring to FIG. 4g and FIG. 5a, voids 70, 72, 74, 79 formed in intermetal spacing narrower than the threshold width remain sealed. Voids 76', 78 in FIG. 4g, and 76, 78 in FIG. 5a, formed in intermetal spacings wider than the threshold width are opened and exposed at the surface of first conformal interlevel dielectric 46. The voids contain the atmosphere the device is exposed to while it is being manufactured. Sealed voids 70, 72, 74, 79 continue to contain that atmosphere, which is likely to be air, on the other hand voids 76', 78 in FIG. 4g, and 76, 78 in FIG. 5a, that are opened and exposed at the surface of first conformal interlevel dielectric will be filled with flowable dielectric, typically SOG or SOP. The dielectric constant of the atmosphere the device is exposed to is close to 1, which is much smaller than the dielectric constant of the SOG, which is typically 3.4, or the dielectric constant of SOP, which can range from 2.2 on up. As a result, the capacitance of voids filled with SOG is at least three times the capacitance of sealed voids of the same size, and the capacitance of voids filled with SOP is at least twice the capacitance of sealed voids of the same size.

Figure 4H:
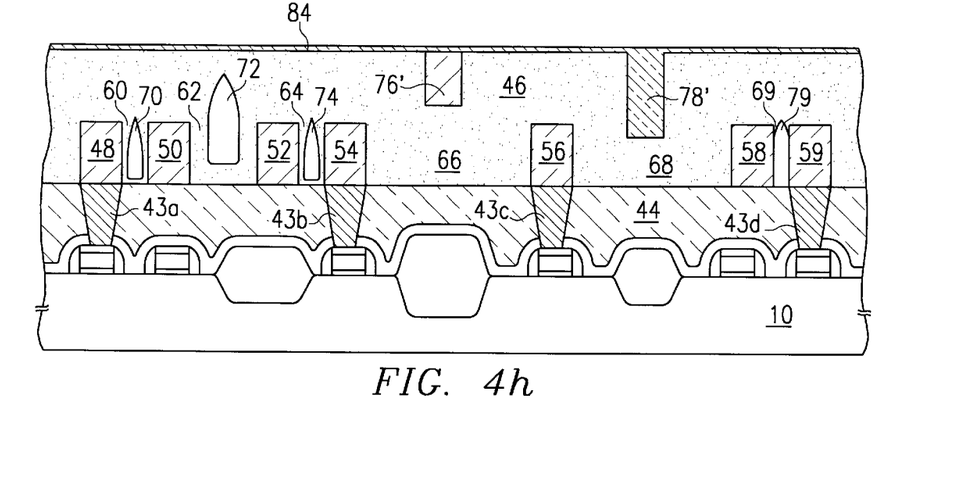
Figure 5B:
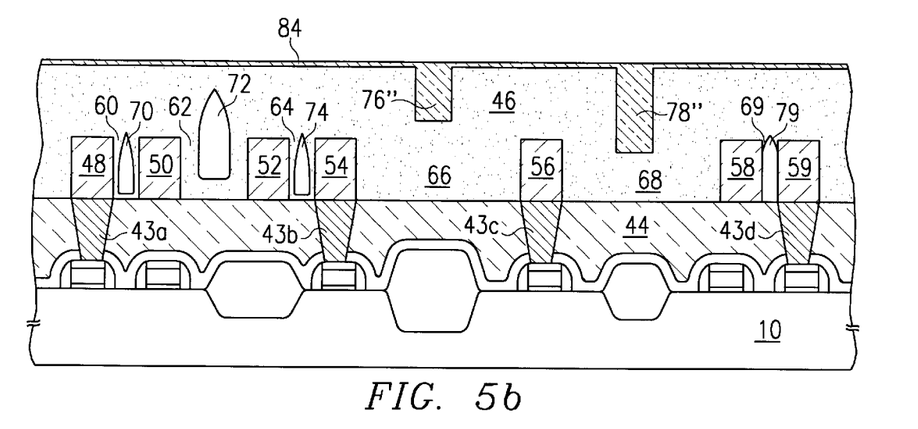

Referring now to FIG. 4h and FIG. 5b, flowable dielectric 84 with good flow properties and void-fill capabilities, preferably Hitachi R7 SOG, is deposited over the first conformal interlevel dielectric 46. The flowable dielectric 84 is deposited at a thickness such that all or most of the spin on dielectric 84 fills exposed voids 76', 78' in FIG. 4h and 76", 78" in FIG. 5b, with practically no flowable dielectric 84 remaining above the metal signal lines. For example, for first conformal interlevel dielectric 46 etched back to 0.5 to 1.5 and currently available flowable dielectric, the deposition thickness can be 2000 Å to 5000 Å, preferably 3000 Å.

If it is not important to reduce interlevel capacitance, for example if the width of the intermetal spacing are above the threshold voltage because the geometries are larger, all of the voids may be filled with flowable dielectric. Since the voids are formed in a controlled manner, voids formed in intermetal spacings of the same size are formed at the same height above the bottom of the device. Thus, once the smallest of the intermetal spacings' widths is known it is possible to determine how far to etch back to insure that all of the voids are exposed, and then to fill all of the voids with flowable dielectric.

Figure 5C:
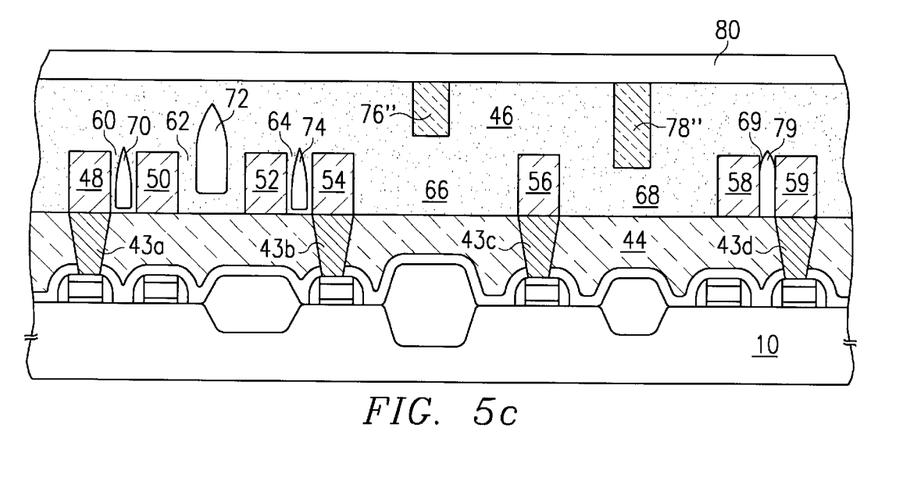
FIG. 5c is a cross-sectional view of an integrated circuit formed according to steps illustrated in FIGS. 4a through 4e and FIGS. 5a and 5b.

An etchback of the flowable dielectric 84 is performed. The etchback is stopped at the upper surface of the first conformal interlevel dielectric 46. The etchback of the flowable dielectric can be performed by a timed etch preferably with the etch rate of flowable dielectric 84 being much higher then the etch rate of first conformal interlevel dielectric 46. It is important to stop the etchback at or close to the surface of first conformal interlevel dielectric 46 without etching any, or very little of, the surface of first conformal interlevel dielectric 46. Etching back the flowable dielectric may also etch back some of first conformal interlevel dielectric 46, and may expose those voids whose top is close to the surface of first conformal interlevel dielectric 46. However, those voids will be reburied again under a second conformal interlevel dielectric 80, as shown in FIG. 3a and 5c, not allowing further process steps to effect or contaminate void 72. Furthermore, since the overetch of the etchback of the spin on dielectric 84 is very small the opening of void 72 will be very small and narrow, typically only a few angstroms wide. An opening of that size will not allow second conformal interlevel dielectric 80 to penetrate into the void, so the void remains filled only with air and the top of the void is closed off by the second conformal interlevel dielectric 80.

Alternatively, the etchback of the flowable dielectric 84 may be skipped, in which case the amount of flowable dielectric that does not fill the exposed voids remains above the first conformal interlevel dielectric, as shown in FIGS. 4h and 5b. Since in the preferred embodiment all or most of the flowable dielectric 84 fills the exposed voids 76', 78' in FIG. 4h and 76", 78" in FIG. 5b, very little if any is left at the top of the first conformal interlevel dielectric 46. The second conformal interlevel dielectric is then deposited. By not etching back the flowable dielectric, one eliminates the possibility that any void will be exposed in the etchback; the second conformal interlevel dielectric 80 still ensures that any unexposed voids remain buried.

The problem of overetch, either of the flowable dielectric or of a subsequent metallization layer, to a point where the top of a sealed void is reached can also be eliminated by layout design. The shape and position of a void is dependent on the conformal properties of the dielectric, the deposition method of the dielectric, the width of the of the intermetal spacing in which the void is formed, and the thickness of the metal signal lines forming the intermetal spacing. For a specific metal thickness and a specific thickness of a particular dielectric, all voids formed in intermetal spacings narrower than a first threshold width will have at least desirable thickness of first conformal interlevel dielectric sealing them. All voids formed in intermetal spacings above a second threshold will be exposed at the surface of first conformal interlevel dielectric 46, and filled with flowable dielectric, while voids formed in intermetal spacings wider than the first threshold width, but narrower than the second threshold width will have a thin layer of first conformal interlevel dielectric sealing the void. The device can be designed to avoid such intermetal spacings. For example, for metal signal lines 0.8 $\mu$m to 1.2 $\mu$m thick, and PECVD or APCVD deposited fluorinated $SiO_2$ etched back to a thickness of 1.0 $\mu$m to 1.2 $\mu$m, voids formed in intermetal spacing narrower than 1.2 $\mu$m will have at least desirable thickness of first conformal interlevel dielectric sealing them, voids formed in intermetal spacings above 2 $\mu$m will be filled with flowable dielectric. Intermetal spacings between 1.2 $\mu$m and 2 $\mu$m can be avoided through layout design.

Figure 6:
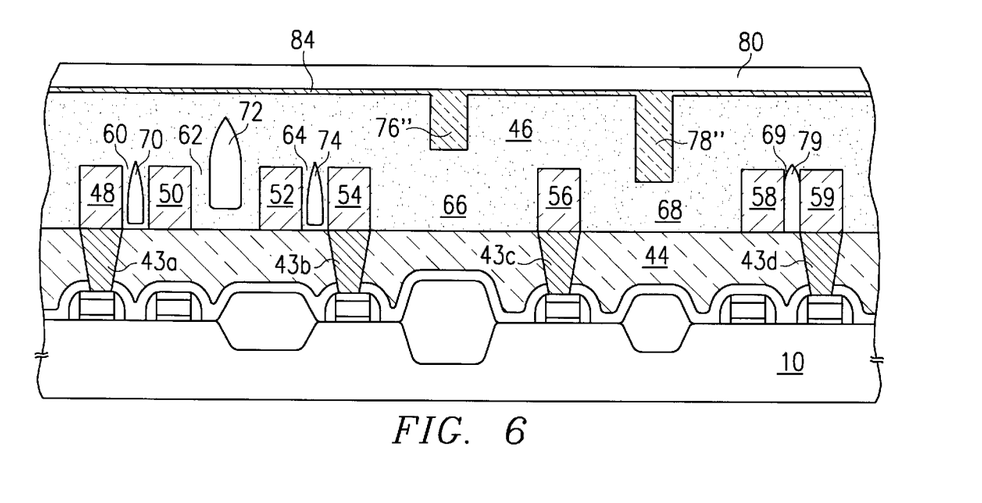
FIG. 6 is a cross-sectional view of an alternative embodiment of the integrated circuit formed according to the present invention.

Referring now to both FIGS. 3a, 5c and 6, second conformal interlevel dielectric 80 is deposited. The combined thickness of the first conformal interlevel dielectric and the second conformal interlevel dielectric should be based on the desired thickness of the dielectric above the voids that are to remain sealed and also based on difficulty of forming vias in the interlevel structure for contacts to subsequent metallization layers. To leave a desired thickness dielectric above voids formed in intermetal spacings below 0.5 $\mu$m when the metal signal lines are 0.8 $\mu$m to 1.2 $\mu$m thick, the preferred combined thickness that first conformal interlevel dielectric 46 and second conformal interlevel dielectric 80 extend above the metal signal lines is between 0.8 $\mu$m and 1.5 $\mu$m, preferably between 1 $\mu$m and 1.2 $\mu$m. Second conformal interlevel dielectric 80 can be 500 Å to 5000 Å thick to achieve this combined thickness. However, if the second conformal interlevel dielectric 80 is deposited at the thinner end of the above range and the layout of the metal signal lines does not eliminate the possibility of sealed voids having tops close to the surface of first conformal interlevel dielectric 46, more care must be taken not to overetch the subsequent metallization layer. Like first conformal interlevel dielectric 46, second conformal interlevel dielectric 80 can be silane based or TEOS based, undoped or fluorinated $SiO_2$.

Second conformal interlevel dielectric 80 can be deposited in a layer thin enough to allow the flowable dielectric to remain close to the top of the insulator structure. When vias are formed in the structure the flowable dielectric will be close to the top of the via and will be covered by a thicker layre of sputter deposited liner layre, typically titanium, titanium nitride, titanium tungsten or a combination thereof, that is at the top of the via, as opposed to the thinner layer toward the bottom on the via. The flowable dielectric will be contained by liner and will not outgas, thus not causing a poisoned via. A thickness of second conformal interlevel dielectric 80 of 1000 Å to 3000 Å will achieve the combined desired thickness described above, and leave the layer of flowable dielectric 84 only 1000 Å to 3000 Å below the top of surface of the interlevel structure.

Second conformal interlevel dielectric 80 can be formed by PECVD, APCVD, or HDP. HDP formed fluorinated $SiO_2$ is preferred. Since the surface of first conformal interlevel dielectric 46 is globally planar and second conformal interlevel dielectric 80 is conformal the surface of second conformal interlevel dielectric 80 is also globally planar.

Referring to FIG. 3b, the process can now be repeated as many times as desired, with the metallization layer and the metal signal lines patterned from the metallization layer formed over the second conformal interlevel dielectric 80 layer of the structure below instead of over insulation layer 44.

Capacitance Between The Metal Signal Lines

In the prior art, voids in the interlevel dielectric are not formed in a controlled manner. Referring to FIG. 1a, the insulator layer 10 below the metal signal lines 11, 12, 13, 14, 15, 16 is not globally planar, and voids 17, 19, formed in intermetal spacings of the same width, are not formed at the same height above the bottom of the device. This prevents one from knowing where to stop the etchback to expose voids in intermetal spacings greater than a certain width and not expose voids in intermetal spacings below that width, or even how far to etchback to ensure that all voids are exposed and can now be filled with flowable dielectric, as was typically preferred in the prior art.

Since voids are not formed at the same height in the prior art, it is impossible to ensure that voids formed in intermetal spacings of the same width are all either exposed and filled, or not exposed. Thus preventing the control of RC delay using voids containing air since the interlevel capacitance, and thus the RC delay, between metal signal lines 13 and 14, having a sealed void 24 filled with air between them, would be much lower than the interlevel capacitance between metal signal lines 11 and 12, having void 22 filled with flowable dielectric between them, even though the intermetal spacings 17 and 19 have the same width, whereas, as illustrated in FIG. 3a, in the present invention voids 70, 74 formed in intermetal spacings of the same width are the same height above the bottom of the device.

Planarizing the insulation layer, as in the prior art shown in FIG. 1b, would only reduce the problems that would be encountered in forming controlled voids for the first interlevel structure. The thin layer of conformal interlevel dielectric 7 used in the prior art produces large voids 25 and 26 in the interlevel dielectric. After these voids are filled with a flowable dielectric and the flowable dielectric is etched back, trenches are formed in voids 25 and 26. This presents a non-planar surface for the next metallization layer and the next interlevel dielectric layer, and subsequent layers of metallization and interlevel dielectric pose the same problems in forming controlled voids as the structure presented in FIG. 1a.

The advantages of the present invention can be observed by comparing the capacitance of the intermetal spacings of the present invention to the capacitances of the intermetal spacings of the prior art. The capacitance of each segment making up the intermetal capacitance is the ratio of the dielectric constant of the segment to the width of the segment, times the area, A, of the surface of the metal signal lines facing the intermetal spacing. Assuming that metal signal lines 50, 52, 12, 13, 31 and 32 are of the same size, the area, A, of the surface of the metal signal lines facing the intermetal spacing will be the same.

The capacitance between each set of metal signal lines of the integrated circuit formed according to the preferred embodiment of the invention depends on the capacitance of the void and the sidewall coverage on both the left and right side of the void. Referring to FIG. 3a, the width of the sidewall coverage on right side of a void is equal to the width of the sidewall coverage on the left side of a void.

The capacitances of the sidewall coverage to the left and right of the void are in series with each other and with the capacitance of the void. Using intermetal spacing 62 as an example, the sidewall coverage on both the right and left side of void 72 is approximately ¼ the width of intermetal spacing 62, and the width of void 72 is approximately ½ the width of intermetal spacing 62, which will be referred to as d for easier reference. Using fluorinated SiO$_2$ with a dielectric constant of 3, as the first conformal interlevel dielectric 46, the intermetal capacitance can be calculated.

Figure 7:
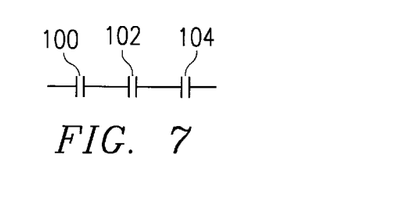

Referring now to FIG. 7, the capacitances in intermetal spacing 62 are shown in schematic form. The capacitance in intermetal spacing 62 is the capacitance of the void 72 in series with the capacitances of the sidewall coverage to the left and to the right of the void 72. Capacitor 100 is the capacitance of the sidewall coverage to the left of void 72. The capacitance of capacitor 100 is the ratio of the dielectric constant of fluorinated SiO$_2$, i.e. 3.0, times A, the area of the surface of the metal signal lines 50, 52 facing the intermetal spacing 62, to the width of sidewall coverage to the left of void 72, so that the capacitance of capacitor 100 is 3A/[d/4]. Capacitor 104 is the capacitance of the sidewall coverage to the right of void 72, which is the same as the capacitance of the sidewall coverage on the left of void 72. Capacitor 102 is the capacitance of void 72, whose capacitance is the ratio of the dielectric constant of air times A to the width of the void 72, i.e. A/[d/2]. The capacitance per unit area in intermetal spacing 62 is the capacitance of capacitor 102 in series with capacitor 100 and in series with capacitor 104, which is:

$$\frac{1}{\left(\frac{1}{\left(\frac{d}{2}\right)}\right) + \left(\frac{1}{\left(\frac{3}{\left(\frac{d}{4}\right)}\right)}\right) + \left(\frac{1}{\left(\frac{3}{\left(\frac{d}{4}\right)}\right)}\right)} = \frac{1.5}{d}$$

Figure 8:
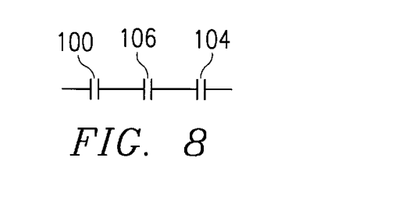
FIG. 8 is an electrical diagram, in schematic form, of the capacitances in intermetal spacing 18 of FIG. 1a or 1b.

FIG. 8 shows the capacitances in intermetal spacing 18 in schematic form. Referring now to FIG 1b, FIG. 3a and FIG. 8 simultaneously, intermetal spacing 18 is the same size as intermetal spacing 62. Void 23 is the same size as void 72. If the same first conformal interlevel dielectric is used, the capacitances of the sidewall coverage on the left and right of void 23 would be the same as the capacitances of the sidewall coverage on the left and right side of void 72. Therefore, capacitors 100 and 104 also represent the capacitance of the sidewall coverage on the left and right side of void 23. Capacitor 106 is the capacitance of void 23. Assuming void 23 is filled with SOG, the capacitance of capacitor 106 is the ratio of the dielectric constant of the SOG filling void 23, typically is 3.4, times A, the area of the surface of the metal signal lines 12, 13 facing the intermetal spacing 23, to the width of void 23, i.e. 3.4A/[d/2]. The capacitance per unit area in intermetal spacing 18 is the capacitance of capacitor 102 in series with capacitor 100 and with capacitor 106, making the capacitance:

$$\frac{1}{\left(\frac{1}{\left(\frac{3.4}{\left(\frac{d}{2}\right)}\right)}\right) + \left(\frac{1}{\left(\frac{3}{\left(\frac{d}{4}\right)}\right)}\right) + \left(\frac{1}{\left(\frac{3}{\left(\frac{d}{4}\right)}\right)}\right)} = \frac{3.1875}{d}$$

Figure 9:
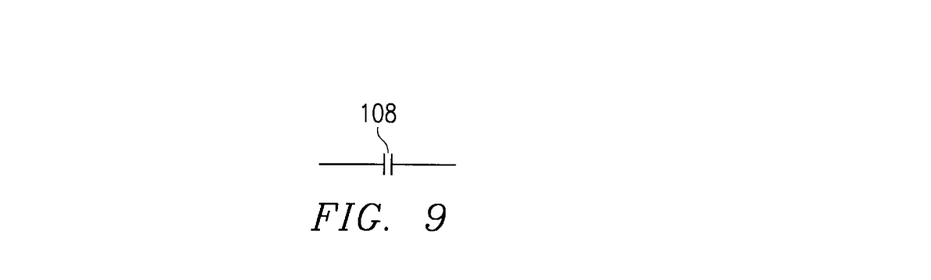
FIG. 9 is an electrical diagram, in schematic form, of the capacitances in intermetal spacing 36 of FIG. 2.

Referring now to prior art FIG. 2 and to FIG. 3a simultaneously, intermetal spacing 36 is the same size as intermetal spacing 62. However, in prior art FIG. 2 the first conformal interlevel dielectric is formed to fill the entire intermetal spacing, without creating any voids. FIG. 9 shows the capacitances in intermetal spacing 36 in schematic form. The capacitance of void 36 is the ratio of the dielectric constant of the dielectric times A, the area of the surface of the metal signal lines 31, 32 facing the intermetal spacing 36, to the width of the void. Capacitor 108 is the capacitance of void 36, which is 3A/d.

Table 1 shows the capacitance per unit area in the intermetal spacing of width d according to the current invention compared to the capacitance per unit area in the intermetal spacing of width d according to the prior art as shown FIG. 1b when the dielectric constant of the SOG is 3.4, the capacitance per unit area in the intermetal spacing of width d according to the prior art as shown FIG. 1b when the dielectric constant of the SOG is 2.5 and the capacitance per unit area in the intermetal spacing of width d according to the prior art as shown in FIG. 2.

TABLE 1

| Dielectric K of the interlevel dielectric | Width of void | Width of sidewall coverage | Capacitance per unit area in current invention | Capacitance per unit area of prior art in FIG. 1, dielectric K of SOG = 3.4 | Capacitance per unit area of prior art in FIG. 1, dielectric K of SOG = 2.5 | Capacitance per unit area of prior art in FIG. 2 |
|---|---|---|---|---|---|---|
| 3 | $\frac{1}{3d}$ | $\frac{1}{3d}$ | $\frac{1.8}{d}$ | $\frac{3.122}{d}$ | $\frac{2.812}{d}$ | $\frac{3}{d}$ |
| 4 | $\frac{1}{3d}$ | $\frac{1}{3d}$ | $\frac{2}{d}$ | $\frac{3.778}{d}$ | $\frac{3.333}{d}$ | $\frac{4}{d}$ |
| 3 | $\frac{1}{2d}$ | $\frac{1}{4d}$ | $\frac{1.5}{d}$ | $\frac{3.188}{d}$ | $\frac{2.727}{d}$ | $\frac{3}{d}$ |
| 4 | $\frac{1}{2d}$ | $\frac{1}{4d}$ | $\frac{1.6}{d}$ | $\frac{3.676}{d}$ | $\frac{3.077}{d}$ | $\frac{4}{d}$ |
| 3 | $\frac{3}{5d}$ | $\frac{1}{5d}$ | $\frac{1.364}{d}$ | $\frac{3.228}{d}$ | $\frac{2.678}{d}$ | $\frac{3}{d}$ |
| 4 | $\frac{3}{5d}$ | $\frac{1}{5d}$ | $\frac{1.429}{d}$ | $\frac{3.617}{d}$ | $\frac{2.941}{d}$ | $\frac{4}{d}$ |
| 3 | t | ≈0 | $\frac{1}{d}$ | $\frac{3.4}{d}$ | $\frac{2.5}{d}$ | $\frac{3}{d}$ |
| 4 | t | ≈0 | $\frac{1}{d}$ | $\frac{3.4}{d}$ | $\frac{2.5}{d}$ | $\frac{4}{d}$ |

As can be seen from Table 1, the capacitance in the intermetal spacings is much lower in the present invention than the capacitance of the intermetal spacings in the prior art. This is achieved by forming sealed voids in the thick first conformal interlevel dielectric. Because voids are formed in a controlled manner, they are either exposed and filled or remain sealed and buried under the first and second conformal interlevel dielectric. This ensures that any sealed voids remain sealed, eliminating the problems posed by voids not filled with flowable dielectric in the prior art, which primarily stemmed from sealed voids becoming opened and exposed to moisture or other contaminants, causing shorts or reducing the life span or accuracy of the device.

As will be appreciated by those skilled in the art, the process steps described above can be used with nearly any conventional process flow.

While the invention has been specifically described with reference to a preferred embodiment, it will be understood by those of ordinary skill in the prior art having reference to the current specification and drawings that various modifications may be made and various alternatives are possible therein without departing from the spirit and scope of the invention.

We claim:

1. A semiconductor device, comprising:
   a insulation layer having a substantially planar top surface, overlying a semiconducting surface of a body;
   a plurality of metal signal lines overlying the insulation layer, so as to form intermetal spacings between adjacent ones of the plurality of metal signal lines;
   a first conformal dielectric having a first dielectric constant overlying each one of the plurality of metal signal lines and disposed between each pair of adjacent metal signal lines of the plurality of metal signal lines so as to form a void within each of the intermetal spacings having a width below a first threshold width;
   each of the voids formed in an intermetal spacing having a width below a second threshold width is sealed by the first conformal dielectric for reducing contamination from moisture and metal;
   each of the voids sealed by the first conformal dielectric containing a void dielectric having a second dielectric constant for reducing capacitance in the intermetal spacing containing the sealed void; and
   a second conformal dielectric overlying the first conformal dielectric.

2. A structure according to claim 1, wherein each of the voids formed in each one of the plurality of intermetal spacings having a width of at least the second threshold width contains a flowable dielectric for filling the voids to reduce contamination from moisture and metal.

3. A structure according to claim 2, wherein the flowable dielectric comprises a silicon dioxide.

4. A structure according to claim 2, wherein the flowable dielectric comprises a polymer.

5. A structure according to claim 2, wherein the second conformal dielectric has a thickness such that the flowable dielectric exposed in a via, formed between an upper surface of the second conformal dielectric and one of the plurality of metal lines, is at most a threshold height from an upper edge of the via.

6. A structure according to claim 1, wherein the second threshold width is at most 1 $\mu$m.

7. A structure according to claim 6, wherein the second threshold width is at most 0.35 $\mu$m.

8. A structure according to claim 1, wherein an upper surface of the first conformal dielectric extends above each one of the plurality of metal signal lines such that a threshold thickness of the first conformal dielectric extends above each the sealed void for insuring that the void remains sealed by the first conformal dielectric.

9. A structure according to claim 1, wherein an upper surface of the second conformal dielectric extends above each one of the plurality of metal signal lines such that a threshold combined thickness of the first conformal dielectric and the second conformal dielectric extends above each the sealed void.

10. A structure according to claim 1, wherein at least one intermetal spacing of the plurality of intermetal spacings consists substantially of a void.

11. A structure according to claim 1, wherein a first void, in a first intermetal spacing of the plurality of intermetal spacings, is at approximately the same vertical position compared to a base of the structure as a second void, in a second intermetal spacing of the plurality of intermetal spacings, wherein a width of the first intermetal spacing is equal to a width of the second intermetal spacings.

12. A structure according to claim 1, wherein each the void contains a flowable dielectric.

13. A structure according to claim 1, wherein the insulation layer comprises an oxide.

14. A structure according to claim 13, wherein the oxide comprises a doped oxide.

15. A structure according to claim 1, wherein:
an upper surface of the first conformal dielectric is about 0.5 $\mu$m to 1.5 $\mu$m above each one of the plurality of metal signal lines;
an upper surface of the second conformal dielectric is about 0.8 $\mu$m to 1.6 $\mu$m above each one of the plurality of metal signal lines.

16. A structure according to claim 15, wherein:
an upper surface of the second conformal dielectric is 500 A–5000 A above the upper surface of the first conformal dielectric.

17. A structure according to claim 1, wherein:
an upper surface of the first conformal dielectric is about 0.8 $\mu$m to 1.2 $\mu$m above each metal signal line of the plurality of set of metal signal lines;
an upper surface of the second conformal dielectric is about 1 $\mu$m to 1.25 $\mu$m above one of the plurality of metal signal lines.

18. A structure according to claim 1, further comprising a layer of flowable dielectric overlying the first conformal dielectric and below the second conformal dielectric.

19. A structure according to claim 1, wherein each one of the plurality of metal signal lines comprises aluminum.

20. A structure according to claim 1, wherein the first conformal dielectric comprises a fluorinated silicone dioxide.

21. A structure according to claim 1, wherein the second conformal dielectric comprises a fluorinated silicone dioxide.

22. A structure consisting of a portion of a semiconductor device, comprising:
a first metal signal line;
a second metal signal line, wherein an intermetal spacing is formed between the first metal signal line and the second metal signal line;
a first conformal dielectric overlying the first metal signal line and the second metal signal line, and disposed between the first metal signal line and the second signal line so as to form a void containing a void dielectric having a second dielectric constant within the intermetal spacing;
a second conformal dielectric overlying the first conformal dielectric;
the void is sealed by the first conformal dielectric.

23. The structure according to claim 1, wherein the void dielectric comprises air.

24. A structure of according to claim 1, further comprising a metallization layer overlying the insulation layer and beneath the plurality of metal signal lines and the first conformal dielectric.

25. The structure according to claim 22, wherein the void dielectric comprises air.

26. A structure according to claim 22, wherein an upper surface of the first conformal dielectric extends above each of the metal signal lines such that a threshold thickness of the first conformal dielectric extends above the sealed void for insuring that the void remains sealed by the first conformal dielectric.

27. A structure according to claim 22, wherein an upper surface of the second conformal dielectric extends above each of the metal signal lines such that a threshold combined thickness of the first conformal dielectric and the second conformal dielectric extends above the sealed void.

28. A structure according to claim 22, wherein:
an upper surface of the first conformal dielectric is about 0.5 $\mu$m to 1.5 $\mu$m above each one of the plurality of metal signal lines;
an upper surface of the second conformal dielectric is about 0.8 $\mu$m to 1.6 $\mu$m above each one of the plurality of metal signal lines.

29. A structure according to claim 22, wherein:
an upper surface of the second conformal dielectric is 500 A–5000 A above the upper surface of the first conformal dielectric.

30. A structure according to claim 22, wherein:
an upper surface of the first conformal dielectric is about 0.8 $\mu$m to 1.2 $\mu$m above each metal signal line of the plurality of set of metal signal lines;
an upper surface of the second conformal dielectric is about 1 $\mu$m to 1.25 $\mu$m above one of the plurality of metal signal lines.

31. A structure according to claim 22, wherein each one of the plurality of metal signal lines comprises aluminum.

32. A structure according to claim 22, wherein the first conformal dielectric comprises a fluorinated silicone dioxide.

33. A structure according to claim 22, wherein the second conformal dielectric comprises a fluorinated silicone dioxide.

34. A semiconductor device, comprising:
a insulation layer having a substantially planar top surface, overlying a semiconducting surface of a body;
a plurality of metal signal lines overlying the insulation layer, so as to form intermetal spacings between adjacent ones of the plurality of metal signal lines;
a first conformal dielectric having a first dielectric constant overlying each one of the plurality of metal signal lines and disposed between each pair of adjacent metal signal lines of the plurality of metal signal lines so as to form a void within each of the intermetal spacings having a width below a first threshold width, each of the voids formed in an intermetal spacing having a width below a second threshold width is sealed by the first conformal dielectric;
each of the voids sealed by the first conformal dielectric containing a void dielectric having a second dielectric constant;
a first void, in a first intermetal spacing of the plurality of intermetal spacings, is at approximately the same vertical position compared to a base of the structure as a second void, in a second intermetal spacing of the plurality of intermetal spacings, wherein a width of the first intermetal spacing is equal to a width of the second intermetal spacings; and a second conformal dielectric overlying the first conformal dielectric.

35. A structure of according to claim 34, further comprising a metallization layer overlying the insulation layer and beneath the plurality of metal signal lines and the first conformal dielectric.

36. A structure according to claim 34, wherein each the voids formed in each one of the plurality of intermetal spacings having a width of at least the second threshold width contains a flowable dielectric.

37. A structure according to claim 36, wherein the flowable dielectric comprises a silicon dioxide.

38. A structure according to claim 36, wherein the second conformal dielectric has a thickness such that the flowable dielectric exposed in a via, formed between an upper surface of the second conformal dielectric and one of the plurality of metal lines, is at most a threshold distance from an upper edge of the via.

39. A structure according to claim 34, wherein the second threshold width is at most 1 $\mu$m.

40. A structure according to claim 34, wherein the second threshold width is at most 0.35 $\mu$m.

41. A structure according to claim 35, wherein an upper surface of the first conformal dielectric extends above each one of the plurality of metal signal lines such that a threshold thickness of the first conformal dielectric extends above each the sealed void.

42. A structure according to claim 34, wherein an upper surface of the second conformal dielectric extends above each one of the plurality of metal signal lines such that a threshold combined thickness of the first conformal dielectric and the second conformal dielectric extends above each the sealed void.

43. A structure according to claim 34, wherein at least one intermetal spacing of the plurality of intermetal spacings consists substantially of a void.

44. A structure according to claim 34, wherein each the void contains a flowable dielectric.

45. A structure according to claim 34, wherein the insulation layer comprises an oxide.

46. A structure according to claim 34, wherein:

an upper surface of the first conformal dielectric is about 0.5 $\mu$m to 1.5 $\mu$m above each one of the plurality of metal signal lines;

an upper surface of the second conformal dielectric is about 0.8 $\mu$m to 1.6 $\mu$m above each one of the plurality of metal signal lines.

47. A structure according to claim 34, wherein:

an upper surface of the second conformal dielectric is 500 A–5000 A above the upper surface of the first conformal dielectric.

48. A structure according to claim 34, wherein:

an upper surface of the first conformal dielectric is about 0.8 $\mu$m to 1.2 $\mu$m above each metal signal line of the plurality of set of metal signal lines;

an upper surface of the second conformal dielectric is about 1 $\mu$m to 1.25 $\mu$m above one of the plurality of metal signal lines.

49. A structure according to claim 34, further comprising a layer of flowable dielectric overlying the first conformal dielectric and below the second conformal dielectric.

50. A structure according to claim 34, wherein each one of the plurality of metal signal lines comprises aluminum.

51. A structure according to claim 34, wherein the first conformal dielectric comprises a fluorinated silicone dioxide.

52. A structure according to claim 34, wherein the second conformal dielectric comprises a fluorinated silicone dioxide.

\* \* \* \* \*